(12) United States Patent
Yang et al.

(10) Patent No.: US 8,076,973 B2
(45) Date of Patent: *Dec. 13, 2011

(54) FULLY DIFFERENTIAL AMPLIFIER WITH CONTINUOUS-TIME OFFSET REDUCTION

(75) Inventors: Tawei Yang, Fremont, CA (US); Larry Farnsley, San Jose, CA (US)

(73) Assignee: Intelleflex Corporation, Santa Clara, CA (US)

( * ) Notice: Subject to any disclaimer, the term of this patent is extended or adjusted under 35 U.S.C. 154(b) by 890 days.

This patent is subject to a terminal disclaimer.

(21) Appl. No.: 11/677,909

(22) Filed: Feb. 22, 2007

(65) Prior Publication Data

US 2008/0204138 A1    Aug. 28, 2008

(51) Int. Cl.
*H03F 3/45*    (2006.01)
(52) U.S. Cl. ..................... 330/258; 330/259
(58) Field of Classification Search .......... 330/259, 330/9, 258
See application file for complete search history.

(56) References Cited

U.S. PATENT DOCUMENTS

| | | | | |
|---|---|---|---|---|
| 4,213,098 A * | 7/1980 | Tsividis | ......... | 330/253 |
| 4,371,843 A | 2/1983 | Fang et al. | ......... | 330/253 |
| 5,023,567 A | 6/1991 | O'Shaughnessy et al. | ... | 330/253 |
| 5,218,320 A * | 6/1993 | Albouy et al. | ......... | 330/259 |
| 5,381,114 A | 1/1995 | Pena-Finol et al. | ......... | 330/258 |
| 5,451,898 A | 9/1995 | Johnson | ......... | 327/563 |
| 5,455,539 A | 10/1995 | Mazoyer et al. | ......... | 330/258 |
| 5,568,089 A | 10/1996 | Maru | ......... | 330/253 |
| 5,729,178 A | 3/1998 | Park et al. | ......... | 330/258 |
| 5,955,922 A | 9/1999 | Nicollini et al. | ......... | 330/258 |
| 6,049,246 A | 4/2000 | Kozisek et al. | ......... | 330/9 |
| 6,140,872 A | 10/2000 | McEldowney | ......... | 330/9 |
| 6,140,877 A | 10/2000 | Forbes | ......... | 330/258 |
| 6,229,443 B1 | 5/2001 | Roesner | ......... | 340/572.1 |
| 6,297,698 B1 | 10/2001 | Callahan, Jr. | ......... | 330/254 |
| 6,346,858 B1 | 2/2002 | Forbes | ......... | 330/258 |
| 6,362,682 B2 | 3/2002 | Shulman | ......... | 327/562 |
| 6,472,939 B2 | 10/2002 | Forbes | ......... | 330/253 |
| 6,525,608 B2 | 2/2003 | Krupnik | ......... | 330/253 |
| 6,552,611 B2 | 4/2003 | Yamamoto | ......... | 330/253 |

(Continued)

FOREIGN PATENT DOCUMENTS

EP    0632581    6/1994

OTHER PUBLICATIONS

Office Action Summary from U.S. Appl. No. 11/303,897 which was mailed on Apr. 30, 2009.

(Continued)

*Primary Examiner* — Michael Shingleton
(74) *Attorney, Agent, or Firm* — Zilka-Kotab, PC

(57) ABSTRACT

A fully differential amplifier circuit according to one embodiment includes a first section for generating first and second output signals on first and second outputs from first and second input signals; a first feedback loop coupled to the first section, the first feedback loop including a second section for adjusting the first output signal towards a common mode voltage level, and for reducing an offset voltage of the first output signal; a second feedback loop coupled to the first section, the second feedback loop including a third section for adjusting the second output signal towards the common mode voltage level, and for reducing an offset voltage of the second output signal; and a filter section positioned on the first and second feedback loops between outputs of the second and third sections and the first section.

31 Claims, 10 Drawing Sheets

U.S. PATENT DOCUMENTS

| | | | |
|---|---|---|---|
| 6,628,168 B2 | 9/2003 | Martin et al. | 330/253 |
| 6,657,485 B2 | 12/2003 | Kimura | 327/563 |
| 6,747,515 B2 | 6/2004 | Callahan, Jr. | 330/254 |
| 6,753,730 B2 | 6/2004 | Yamamoto | 330/253 |
| 6,850,109 B2 | 2/2005 | Kimura | 327/361 |
| 7,385,442 B1 | 6/2008 | Ripley | 330/9 |
| 7,495,511 B2 | 2/2009 | Gilbert et al. | 330/254 |
| 2001/0026192 A1 | 10/2001 | Yamamoto | 330/253 |
| 2002/0008581 A1 | 1/2002 | Callahan, Jr. | 330/254 |
| 2002/0053949 A1 | 5/2002 | Forbes | 330/253 |
| 2002/0089377 A1 | 7/2002 | Hwang | 330/252 |
| 2002/0171486 A1 | 11/2002 | Krupnik | 330/253 |
| 2003/0006841 A1 | 1/2003 | Martin et al. | 330/253 |
| 2003/0206061 A1 | 11/2003 | Yamamoto | 330/253 |
| 2007/0139116 A1 | 6/2007 | Yang et al. | 330/258 |

OTHER PUBLICATIONS

Allen, Phillip.E. et al., "CMOS Analog Circuit Design" Oxford University Press, New York, 2002.

International Preliminary Examination Report from PCT Application No. PCT/US06/46339 mailed on Oct. 17, 2008.

International Search Report and Written Opinion from PCT Application No. PCT/USO6/46339 mailed on Sep. 28, 2007.

International Preliminary Report from PCT Application No. PCT/US06/46339 mailed on Jun. 26, 2008.

Written Opinion and International Search Report from PCT Application No. PCT/US07/26204 mailed on Sep. 22, 2008.

International Preliminary Report on Patentability from PCT Application No. PCT/US07/26204 mailed on Aug. 6, 2009.

* cited by examiner

FULLY DIFFERENTIAL AMPLIFIER WITH CONTINUOUS-TIME OFFSET REDUCTION

FIELD OF THE INVENTION

The present invention relates to amplifiers, and more particularly, this invention relates to fully differential amplifiers.

BACKGROUND OF THE INVENTION

Differential amplifiers are commonly employed in electronic devices that use analog circuits. In addition to a variety of discrete circuit applications, differential amplifiers are also used in many integrated devices such as, for example, operational amplifiers. Operational amplifiers have been the most common building blocks in analog and mixed signal circuits because of their high gain, high input impedance, high power supply noise rejection and other special characteristics. With their high gain property, one of their many applications is to amplify very small and weak signals to larger ones.

The growing demand for mobile or portable electronic equipment or devices has increased the need to produce simple, lightweight, energy-efficient electronic equipment, which has resulted in an increased demand for low-power operational amplifiers. However, there are some limitations for physical implementation of operational amplifiers, such as signal-to-noise ratio (SNR), offset voltage, and common-mode voltage range.

Generally speaking, to reduce the power consumption of an operational amplifier, the operational amplifier must be operated at relatively low supply voltages. Unfortunately, as the supply voltage is reduced, the useful dynamic input range and output range of the operational amplifier is reduced. In general, the operating range of the input terminals of an operational amplifier depends on the input stage configuration of the operational amplifier. As is well known, the operating range or dynamic range of the input terminals of a differential amplifier is commonly referred to as a common-mode input range (CMR). In the case of an operational amplifier buffer circuit such as, for example, a voltage follower, the CMR of the operational amplifier determines the dynamic range of the buffer inputs. A differential amplifier that provides a CMR substantially equal to the voltage drop across the supply terminals of the differential amplifier is commonly referred to as a rail-to-rail CMR differential amplifier.

FIG. 1 shows a fully differential input stage 100 which is commonly used in an operational amplifier. NMOS devices MN1 and MN2 are ideally identical, as are the PMOS devices MP1 and MP2. MP1 and MP2 are biased by a current mirror with bias voltage Vbp, so each PMOS has same amount of current. In a fully balanced condition, MN1 and MN2 with the same DC voltage at IN an IP have the same amount of current. MN1 and MN2's currents are provided by MN3 which is mirrored by MN4 with bias voltage Vbn. With fixed length, the width of MN3 is two times that of MH4, when MP3, MP1, and MP2 have the same size. Ideally, when input signals IN and IP are at the same DC voltage, output signals ON and OP should have the same DC level which is a known common mode level. In reality, however, because of process variations, the DC potentials of the output signals ON and OP are not the same and not well-defined.

Particularly, because of variations of threshold voltages, mobility, and geometry from original target device specifications during fabrication for PMOS and NMOS type devices, one type of device is stronger than the other one. This unpredictable situation prevents DC outputs ON and OP from being well-defined in the circuit 100 of FIG. 1. When IN and IP are same DC value, voltages of OP and ON both could drift in the same direction to the stronger device (either PMOS or NMOS) to fulfill Kirchoff's current summing law. This drift phenomenon could either degrade amplifier gain or output voltage swing. For example, if stronger devices go into the linear region to maintain the same current as the weaker devices, the output resistance and the gain are significantly reduced.

Furthermore, because of process variations, the same type devices with the same size and bias conditions could be non-identical, in FIG. 1. MN1 and MN2 might not be identical in silicon. Likewise, MP1 and MP2 might not be identical. Mismatches between same type, size, and bias conditions cause unequal amplifier outputs. That is, with equal potential inputs at IP and IN, output voltages at OP and ON are different. When the inputs are the same, the DC difference between the outputs is known as output offset voltage.

Common Mode Feed Back (CMFB) circuits are used to create a well-defined DC common mode output level. A typical CMFB circuit 200 is shown in FIG. 2. To define the desired output voltage level Vcm, two additional differential amplifiers are added. One of the amplifiers consists of CN1, CN2, CN3, and CP1 in circuit 200. The other one consists of CN4, CN5, CN6, and CP1. For each additional amplifier, Vcm provides reference at one input. ON or OP are treated as the other input for the differential amplifier. Each additional amplifier then compares DC value Vera to OP or ON. The differences are averaged by transistor CP1 and biasing voltage Vbp. Vbp ideally adjusts the MP1 and MP2 currents for either addition or subtraction with the same amount of current for both devices, so OP and ON can be adjusted toward Vcm in the same direction. In other words, by sensing the DC output voltage of the output signals OP and ON and by comparing the output signals OP and ON with the desired output DC voltage level Vcm, the output signals OP and ON are adjusted in same direction to be the same as Vent via the feedback loop. However, present CMFB circuits can only correct the common mode output voltage level. That is, they can correct both OP and ON to a Vera value in the same direction. However, they cannot correct the output offset voltage. That is, OP and ON are adjusted toward Vcm in opposite directions, such that while one current or voltage is added, the other's is reduced.

There are several ways to perform offset cancellation, such as auto zero or using a chopper stabilized amplifier. Those ways need the system clock to be involved, and they are classified as discrete type offset cancellation. They cannot cancel offset voltage in a continuous time domain.

SUMMARY OF THE INVENTION

A fully differential amplifier circuit according to one embodiment includes a first section for generating first and second output signals on first and second outputs from first and second input signals; a first feedback loop coupled to the first section, the first feedback loop including a second section for adjusting the first output signal towards a common mode voltage level, and for reducing an offset voltage of the first output signal; a second feedback loop coupled to the first section, the second feedback loop including a third section for adjusting the second output signal towards the common mode voltage level, and for reducing an offset voltage of the second output signal; and a filter section positioned on the first and second feedback loops between outputs of the second and third sections and the first section.

A fully differential amplifier circuit according to another embodiment includes a first section for generating first and second output signals on first and second outputs from first and second input signals; a first negative feedback loop coupling the first output to a filter section, the first negative feedback loop adjusting the first output signal towards a common mode voltage level, and reducing an offset voltage of the first output signal; a second negative feedback; loop coupling the second output to the filter section, the second negative feedback loop controlling the second negative feedback loop for adjusting the second output signal towards the common mode voltage level, and reducing an offset voltage of the second output signal, wherein the filter section acts as a low pass filter.

A fully differential amplifier circuit according to yet another embodiment includes a first differential cell for generating first and second output signals on first and second outputs from first and second input signals; a first negative feedback loop coupled to the first output of the first differential cell, the first negative feedback loop including a second differential cell for generating a first feedback signal, the feedback signal being for adjusting the first output signal towards a common mode voltage level, and for reducing an offset voltage of the first output signal; a second negative feedback loop coupled to the second output of the first differential cell, the second negative feedback loop including a third differential cell controlling the second negative feedback loop for generating a first feedback signal, the feedback signal being for adjusting the second output signal towards the common mode voltage level, and for reducing an offset voltage of the second output signal; and a low pass filter section positioned between the first differential cell and the second and third differential cells, the low pass filter section being for filtering the first and second feedback signals.

In some embodiments, the first, second and third sections may differential cells.

In some embodiments, the first section may include a first transistor being controlled by the first input signal and a second transistor being controlled by the third section; wherein the first section further includes a third transistor being controlled by the second input signal and a fourth transistor being controlled by the second section. IN one approach, the transistors operate in a subthreshold region thereof.

In some embodiments, the filter section may act as a low pass filter.

In some embodiments, signals from the filter section reduce the offset voltages of the first and second output signals and set a common mode voltage of the first and second output signals.

In some embodiments, the filter section includes a first unity gain buffer coupled to the first feedback loop and a second unity gain buffer coupled to the second feedback loop, wherein outputs from the first and second unity gain buffers are coupled together via a capacitor.

In some embodiments, the filter section filters out substantially all signals from the feedback loops having about the same frequency as data portions of the input signals.

In some embodiments, the filter section includes a unity gain buffer.

In some embodiments, the first feedback loop couples the first output to the second section, wherein the second feedback loop couples the second output to the third section.

In some embodiments, a ratio of a current applied to the first section to a current applied to the second section is less than about 5:1.

In some embodiments, a ratio of a current applied to the first section to a current applied to the second section is less than about 2:1.

A method for setting a voltage level and cancelling an offset voltage of an amplified signal according to one embodiment of the present invention includes generating first and second output signals from first and second input signals in a first section of a circuit, comparing the first and second output signals to a common mode voltage level for generating first and second feedback signals in second and third sections of the circuit; and filtering out from the feedback signals at least at least a portion thereof having a frequency lower than a data portion of the input signals using a filter section positioned between the first section and at least the second section, the feedback signals simultaneously adjusting the first and second output signals towards the common mode voltage level and reducing an offset voltage of the first and second output signals.

An RFID system includes a plurality of RFID tags having one or more of the circuits described above or performing a method described above, and an RFID interrogator in communication with the RFID tags.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

BEST MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein.

The following specification describes a differential amplifier that uses feedback loops to individually control the differential outputs for providing offset cancellation while setting a common mode output, Many types of devices can take advantage of the embodiments disclosed herein, including but not limited to Radio Frequency Identification (RFID) systems and other wireless devices/systems; pacemakers; portable electronic devices; audio devices and other electronic devices; smoke detectors; etc. To provide a context, and to aid in understanding the embodiments of the invention, much of the present description shall be presented in terms of an RFID system such as that shown in FIG. 3. It should be kept in mind that this is done by way of example only, and the invention is not to be limited to RFID systems, as one skilled in the art will appreciate how to implement the teachings herein into electronics devices in hardware and/or software. Examples of hardware include Application Specific Integrated Circuits (ASICs), printed circuits, monolithic circuits, reconfigurable hardware such as Field Programmable Gate Arrays (FPGAs), etc. Further, the methodology disclosed herein can also be incorporated into a computer program product such as a computer disc containing software. Further, such software can be downloadable or otherwise transferable from one computing device to another via network, nonvolatile memory device, etc.

Figure 1:
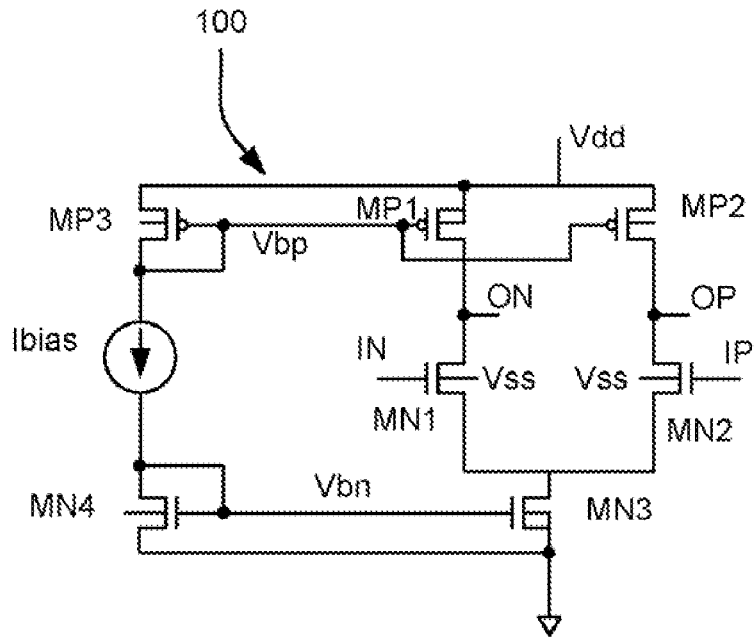
FIG. 1 is a circuit diagram of an input stage of an operational amplifier.
Figure 2:
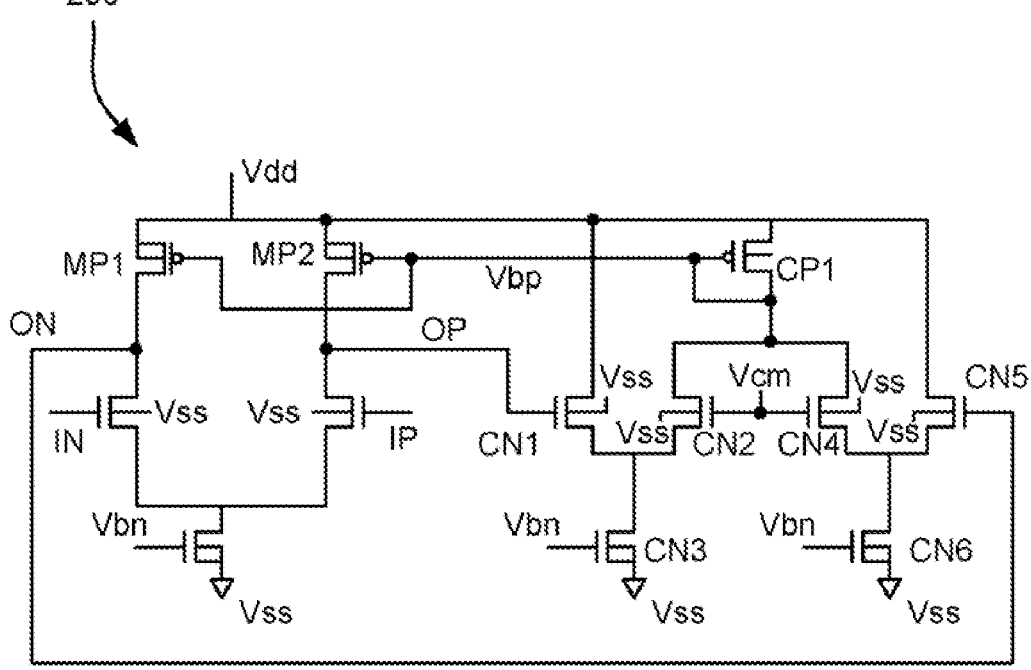
FIG. 2 is a circuit diagram of a common mode feedback circuit.
Figure 3:
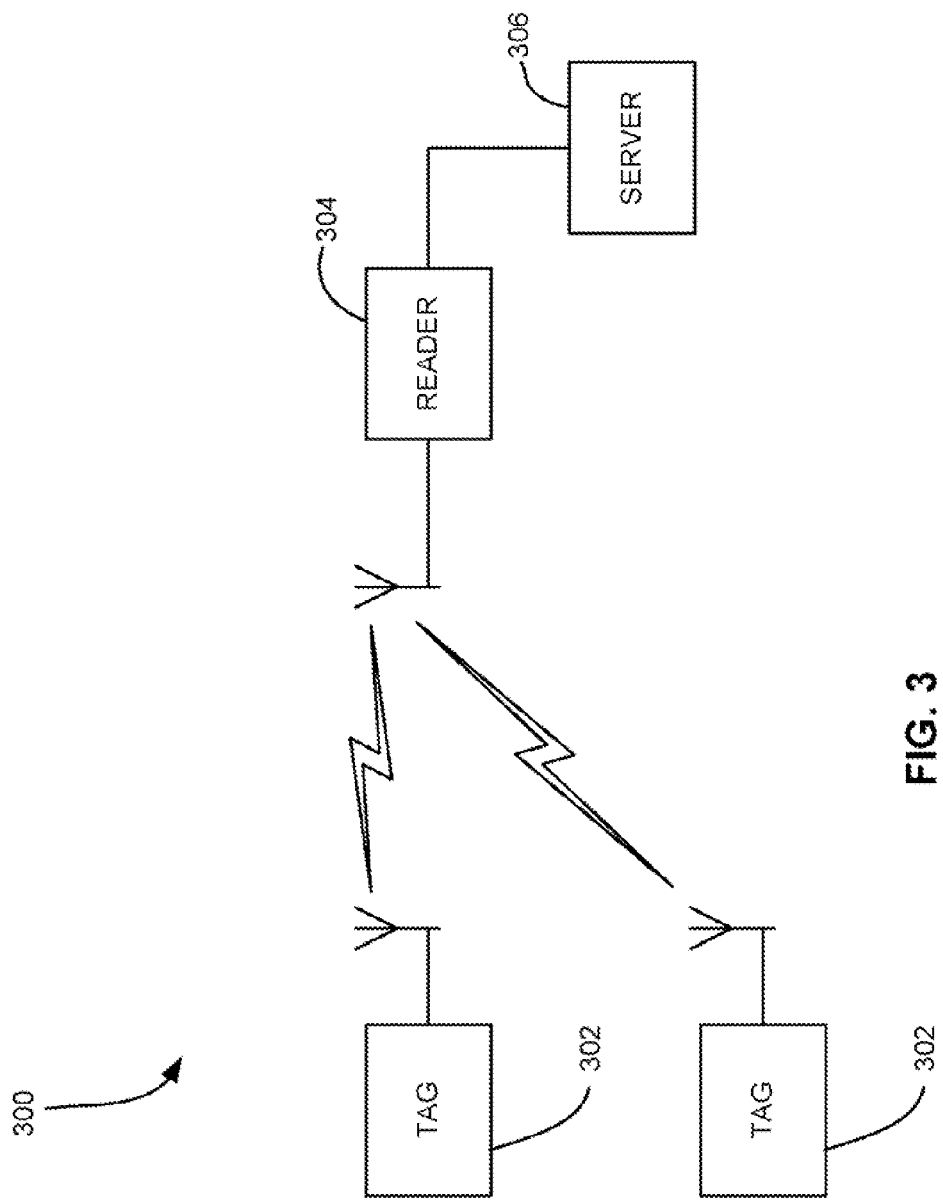
FIG. 3 is a system diagram of an RFID system.

As shown in FIG. 3, an RFID system 300 includes a tag 302, a reader 304, and an optional server 306. The tag 302 includes an IC chip and an antenna. The IC chip includes a digital decoder needed to execute the computer commands that the tag 302 receives from the tag reader 304. The IC chip also includes a power supply circuit to extract and regulate power from the RF reader; a detector to decode signals from the reader; a backscatter modulator, a transmitter to send data back to the reader; anti-collision protocol circuits; and at least enough memory to store its EPC code.

Communication begins with a reader 304 sending out signals to find the tag 302. When the radio wave hits the tag 302 and the tag 302 recognizes and responds to the reader's signal, the reader 304 decodes the data programmed into the tag 302. The information is then passed to a server 306 for processing, storage, and/or propagation to another computing device. By tagging a variety of items, information about the nature and location of goods can be known instantly and automatically.

Many RFID systems use reflected or "backscattered" radio frequency (RF) waves to transmit information from the tag 302 to the reader 304. Since passive (Class-1 and Class-2) tags get all of their power from the reader signal, the tags are only powered when in the beam of the reader 304.

The Auto ID Center EPC-Compliant tag classes are set forth below:

Class-1
Identity tags (RF user programmable, maximum range 3 m)
Lowest cost
Class-2
Memory tags (8 bits to 128 Mbits programmable at maximum 3 m range)
Security & privacy protection
Low cost
Class-3
Semi-Active tags
Battery tags (256 bits to 64 Kb)
Self-Powered Backscatter (internal clock, sensor interface support)
100 meter range
Moderate cost
Class-4
Active tags
Active transmission (permits tag-speaks-first operating modes)
Up to 30,000 meter range
Higher cost In RFID systems where passive receivers (i.e., Class-1 and Class-2 tags) are able to capture enough energy from the transmitted RF to power the device, no batteries are necessary. In systems where distance prevents powering a device in this manner, an alternative power source must be used. For these "alternate" systems (also known as semi-passive), batteries are the most common form of power. This greatly increases read range, and the reliability of tag reads, because the tag doesn't need power from the reader. Class-3 tags only need a 10 mV signal from the reader in comparison to the 500 mV that a Class-1 tag needs to operate. This 2,500:1 reduction in power requirement permits Class-3 tags to operate out to a distance of 100 meters or more compared with a Class-1 range of only about 3 meters.

Figure 4:
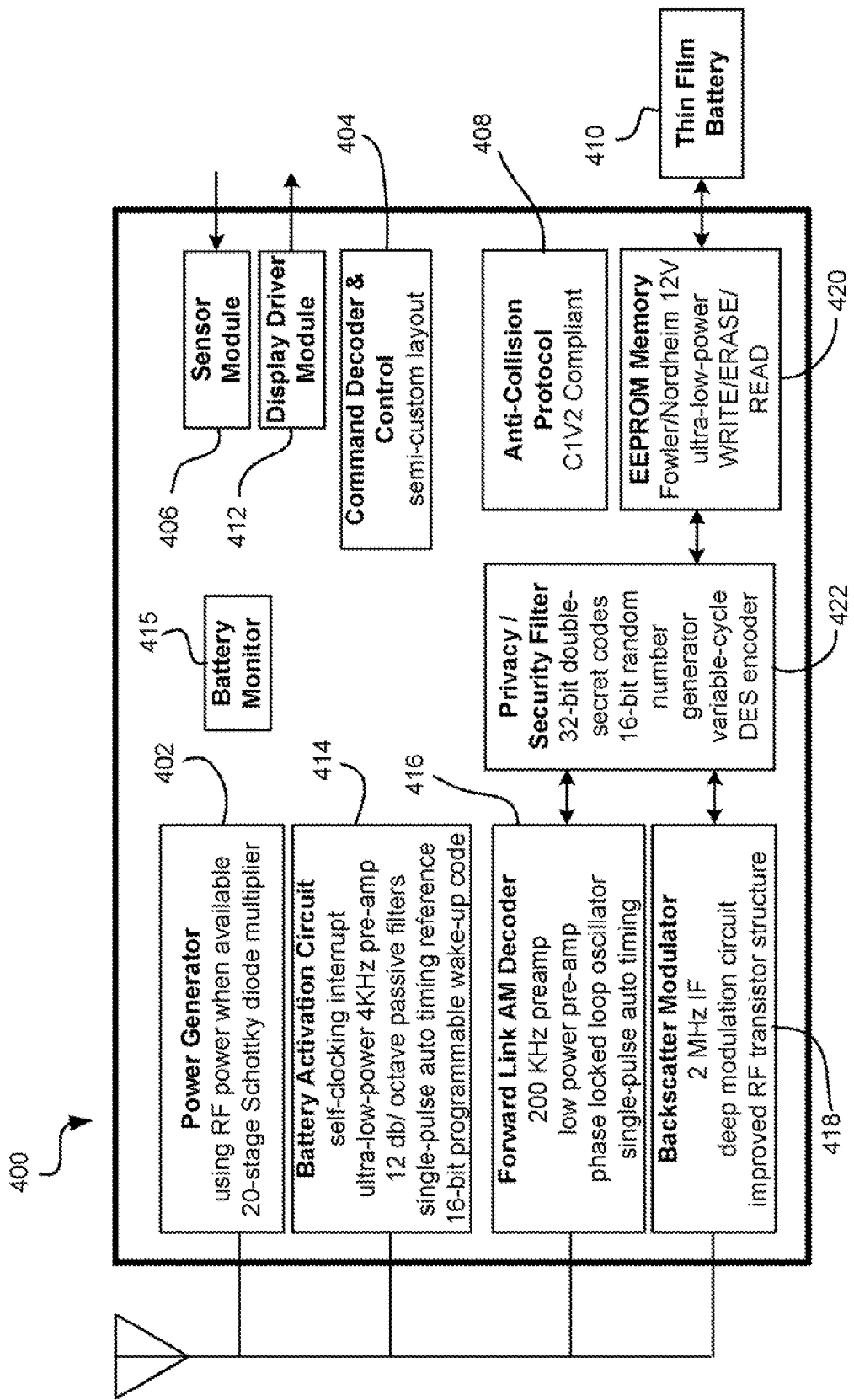
FIG. 4 is a system diagram for an integrated circuit (IC) chip for implementation in an RFID tag.

Embodiments of the present invention may be implemented in a Class-3 or higher Class chip. FIG. 4 depicts a circuit layout of a Class-3 chip 400 according to an illustrative embodiment for implementation in an RFID tag. This Class-3 chip can form the core of RFID chips appropriate for many applications such as identification of pallets, cartons, containers, vehicles, or anything where a range of more than 2-3 meters is desired. As shown, the chip 400 includes several industry-standard circuits including a power generation and regulation circuit 402, a digital command decoder and control circuit 404, a sensor Interface module 406, a C1V2 interface protocol circuit 408, and a power source (battery) 410. A display driver module 412 can be added to drive a display.

A battery activation circuit 414 is also present to act as a wake-up trigger. In brief the battery activation circuit 414 may include an ultra-low-power, narrow-bandwidth preamplifier with an ultra low power static current drain. The battery activation circuit 414 may also Include a self-clocking interrupt circuit and uses an innovative user-programmable digital wake-up code. The battery activation circuit 414 draws less power during its sleeping state and is much better protected against both accidental and malicious false wake-up trigger events that otherwise would lead to pre-mature exhaustion of the Class-3 tag battery 410.

A battery monitor 415 can be provided to monitor power usage in the device The information collected can then be used to estimate a useful remaining life of the battery.

A forward link AM decoder 416 uses a simplified phase-lock-loop oscillator that requires an absolute minimum amount of chip area. Preferably, the circuit 416 requires only a minimum string of reference pulses.

A backscatter modulator block 418 preferably increases the backscatter modulation depth to more than 50%.

A memory cell, e.g., EEPROM is also present. In one embodiment, a pure, Fowler-Nordheim direct-tunneling-through-oxide mechanism 420 is present to reduce both the WRITE and ERASE currents to less than 0.1 μA/cell in the EEPROM memory array. Unlike any RFID tags built to date, this will permit designing of tags to operate at maximum range even when WRITE and ERASE operations are being performed.

The module 400 may also incorporates a highly-simplified, yet very effective, security encryption circuit 422. Other security schemes, secret handshakes with readers, etc. can be used.

Only four connection pads (not shown) are required for the chip 400 to function: Vdd to the battery, ground, plus two antenna leads to support multi-element omni-directional antennas. Sensors to monitor temperature, shock, tampering, etc. can be added by appending an industry-standard I2C interface to the core chip.

It should be kept in mind that the present invention can be implemented in any type of device, and the chip 400 described above is presented as only one possible implementation.

Figure 5:
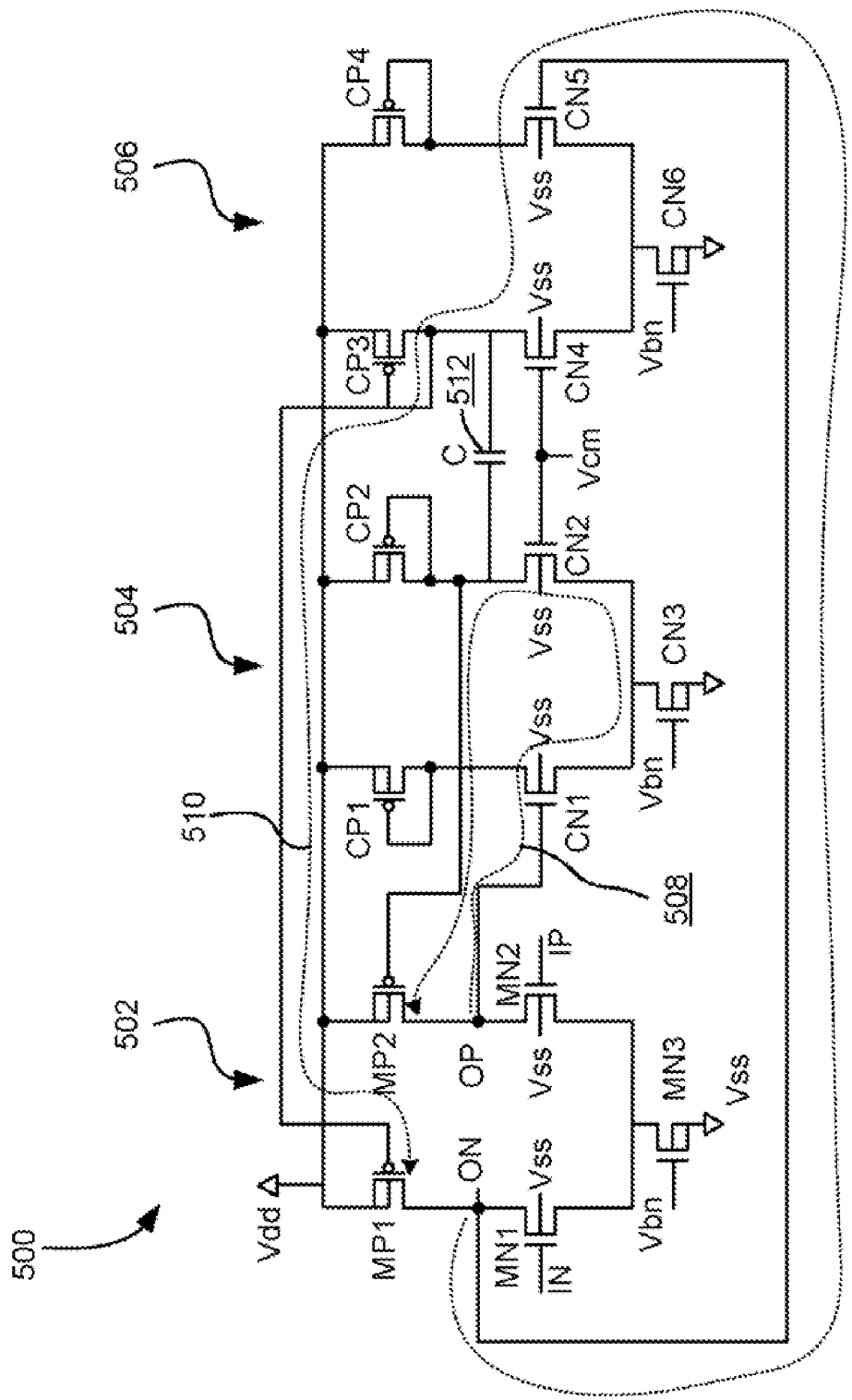
FIG. 5 is a circuit diagram of a fully differential amplifier circuit according to one embodiment of the present invention.

In RF systems such as RFID systems, output signals received from the AM detector can be very weak, e.g., a few hundred microvolts. In order to utilize such a weak signal, it is usually necessary to amplify it. FIG. 5 depicts a circuit 500 that combines the ability to set a DC common mode output voltage with DC output offset cancellation. This circuit 500 can function as a fully differential amplifier. As shown, the circuit 500 includes first, second and third sections 502, 504, 506. Each of these sections is preferably a differential cell, as described below. An amplifier implementing the fully differential amplifier circuit 500 may include multiple stages, each stage being substantially like the circuit 500 shown.

The first section 502 is the main amplification section, which amplifies input signals IN, IP. In an RFID application, input signals IN, IP originating from an AM detector are passed to the first section 502. In other applications, input signals IN, IP can be from another signal source. Differential output signals ON, OP are generated from the input signals IN IP. The first section 502 shown includes a pair of transistors MN1, MN2 which are controlled by the input signals IN, IP. The first section 502 also includes a pair of transistors MP1, MP2 which are controlled by negative feedback, loops 508, 510, respectively, the general paths of which are shown in dashed lines. How the negative feedback loops 508, 510 function in conjunction with the various sections of the circuit 500 is presented in more detail below. Each differential output ON, OP is monitored separately.

The second section 504 in this exemplary embodiment includes transistors CP1, CP2, CN1, CN2, and CN3. The third section 506 in this exemplary embodiment includes transistors CP3, CP4, CN4, CN5, and CN6. The second and third sections 504, 506 compensate for the offset voltage and also set the common mode output via the negative feedback loops 508, 510.

Each feedback loop can individually adjust output DC voltages OP and ON, toward a common mode reference voltage Vcm By sensing the DC output voltage of the output signals OP and ON and by comparing the output signals OP and ON with the desired output DC voltage level Vcm, the output signals OP and ON are adjusted to be at about the same level as Vent via the respective feedback loop.

In operation, for example, to set output signal OP to about the common mode voltage level, the output OP is compared with Vcm in the second section 504 of the circuit 500 via transistors CN1 and CN2. If the output OP is higher than Vcm, the first feedback loop 508 weakens transistor MP2 and draws down the output signal OP. The third section 506 functions similarly with the second feedback loop 510 to set output signal ON to about the common mode voltage level.

The negative feedback scheme not only sets a DC common mode voltage but also adjusts any DC difference between OF and ON toward Vera. This DC difference between OP and ON is the output offset voltage, when IN and IP have the same DC voltage. The offset voltage is caused by MN1 and MN2 or MP1 and MP2 devices in the circuit 502 not being perfectly matched due to manufacturing variations, etc.

Figure 6:
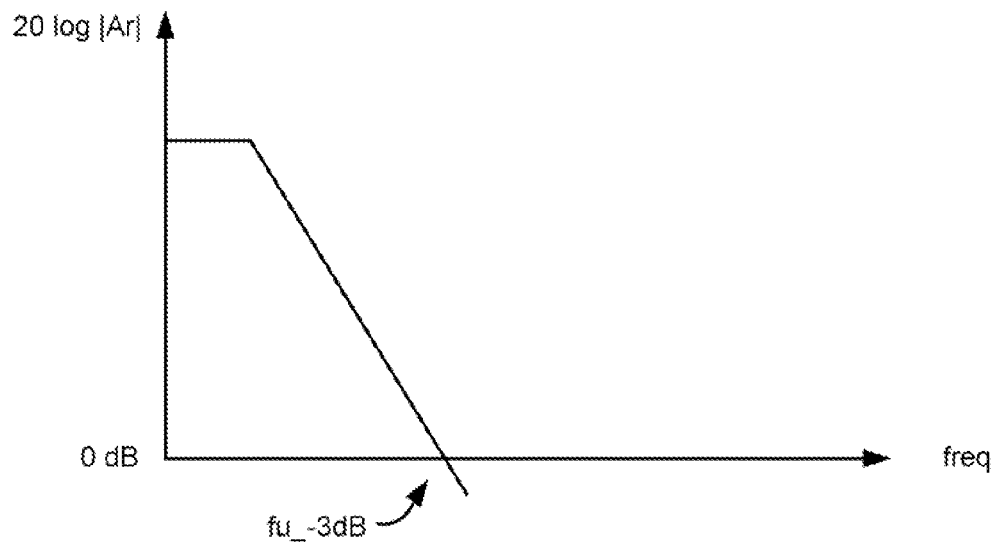
FIG. 6 is a graph of an amplifier frequency response.

Because offset voltage and common mode voltage are DC values, a capacitor (C) 512 is added. Combining the capacitor and an amplifier, e.g., second and/or third sections, a low pass filter is created by taking advantage of amplifier's gain rolling-off frequency response, as shown in FIG. 6. This low pass filter limits both the common mode and differential mode feedback loop bandwidth by its e.g., −3 db gain bandwidth—f__−3 db; meanwhile, it maintains feedback loop gain at a lower frequency for correction. The differential mode feedback loop bandwidth is smaller than the frequencies of input signals IN, IP, but the common mode loop bandwidth can be larger than the frequencies of input signals IN, IP. In this way, the offset and DC output information can pass through each loop; common mode voltage is set and offset voltage correction are achieved by the two individual negative feedback loops 508, 510.

Figure 7:
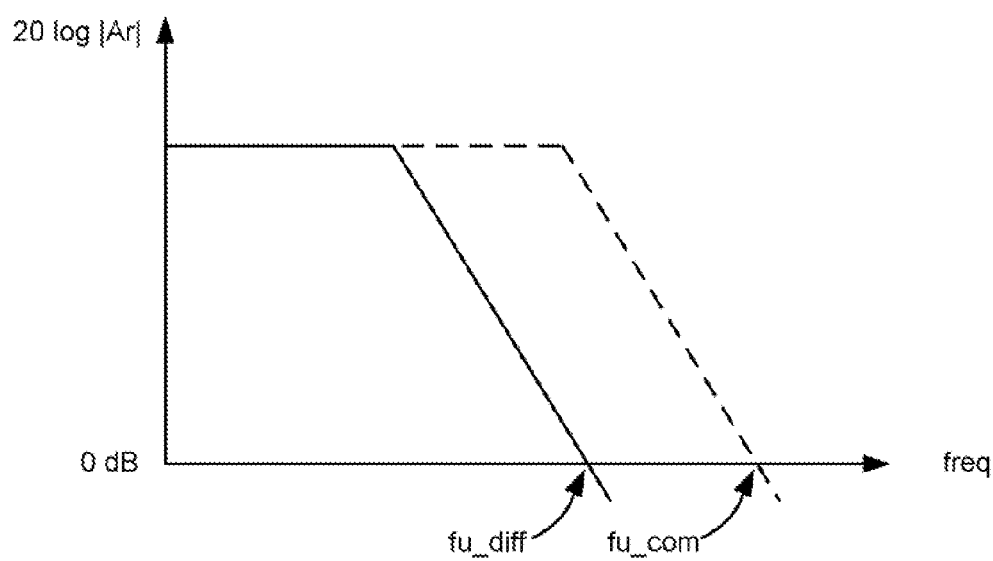
FIG. 7 is a graph of frequency responses for differential and common mode feedback loops.

The filtering operates on the premise that in common mode, if one signal goes high, the other signal goes high, then the coupled capacitor is ineffective. In differential mode, the opposite is true; when one signal goes high, the other signal goes low, and the capacitor effectively doubles its capacitance Thus, because of the nature of the common mode, the common mode feedback signal is not affected by the capacitor. On the other hand, when current, flows into the capacitor, the differential signal feedback (low bandwidth) is affected. So, the differential feedback loop unit-gain bandwidth fu_diff is smaller than common mode feedback loop's fu_com, as shown is FIG. 7.

Again, the purpose of the overall circuit is to amplify the incoming signals IN, IP, so the filtering is preferably selected to cancel only the DC signal offset while allowing high frequency signals to be amplified and output, while low frequencies are fed back to provide the offset cancellation. High frequencies can broadly be defined as frequencies in about the vicinity of the data portion frequency of the incoming signals IN, IP, while low frequencies are somewhere below the data frequency range. Illustratively, high frequencies are greater than about 2 kHz, e.g., 2 kHz and 8 kHz, while low frequencies are smaller than about 2 kHz, e.g., below 1 kHz. In other words, because it is undesirable to cancel the desired part of the signal (high frequency), the low pass filter is implemented to only allow the low frequency part of the differential feedback signal to pass. Thus the feedback has no cancelling effect on the high frequency (desired) signal. The common mode feedback loop has a wider bandwidth and responds faster.

Accordingly, the same two negative feedback loops 508, 510 provide both an offset cancellation signal for cancelling the offset voltage, as well as a common mode adjustment signal.

To conserve power, as well as operate with very low input signal strength, the transistors in any of the sections 502, 504, 506 can operate in the subthreshold range. The transistors in the circuit can also run at strong inversion. Transistors operated in high impedance regions are preferred to keep power consumption low. For instance, the low pass filter frequency is preferably lower than 1 kHz, so it may not be practically applicable to use a purely RC circuit for monolithic application. Because resistance value is more than several Mega ohms, such a large value resistor would need a huge area on the wafer and would create huge and unpredictable parasitic capacitance. In contrast, in preferred embodiments of the present invention, each low pass feedback loop may take advantage of MOS transistor sub-threshold characteristics: low current and high impedance to achieve low pass filtering, low power consumption, and save silicon die area.

In another preferred embodiment, offset cancellation works by controlling a portion of the differential pair current to adjust the DC offset, as above. It also implements a low pass filter by using the nature of amplifier characteristic-gain falling-off at its first pole. See FIG. 6. This first pole takes advantage of the high impedance of the subthreshold region of MOS transistors with a reasonable sized of capacitor, e.g., −18 pf in the common-mode feedback differential pair at each stage of the preamp.

Figure 8:
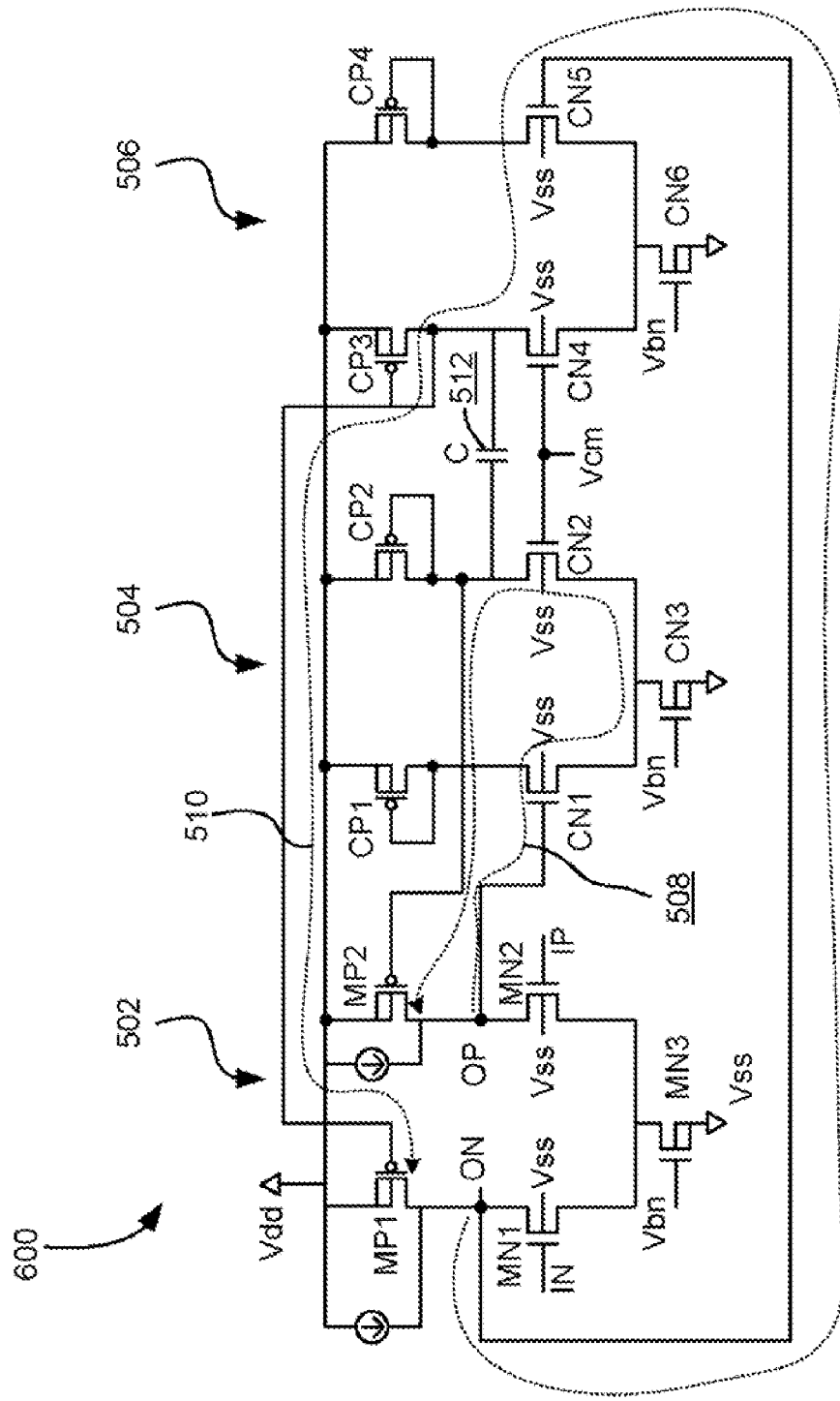
FIG. 8 is a circuit diagram of a fully differential amplifier circuit according to one embodiment of the present invention.

FIG. 8 illustrates an alternate embodiment 600. The inventors have found that the more the current is controlled by the common-mode feedback loop, the more efficient the feedback loop is at correcting the offset voltage. According to calculations performed by the inventors, the ratio of current controlled by the common mode feedback loop to total amount of current vs. offset voltage amplification corresponds to the following for the first stage; ratio=1/2, offset voltage gain=1; ratio=1/4, gain=2; ratio=1/7, gain=4.

Figure 9:
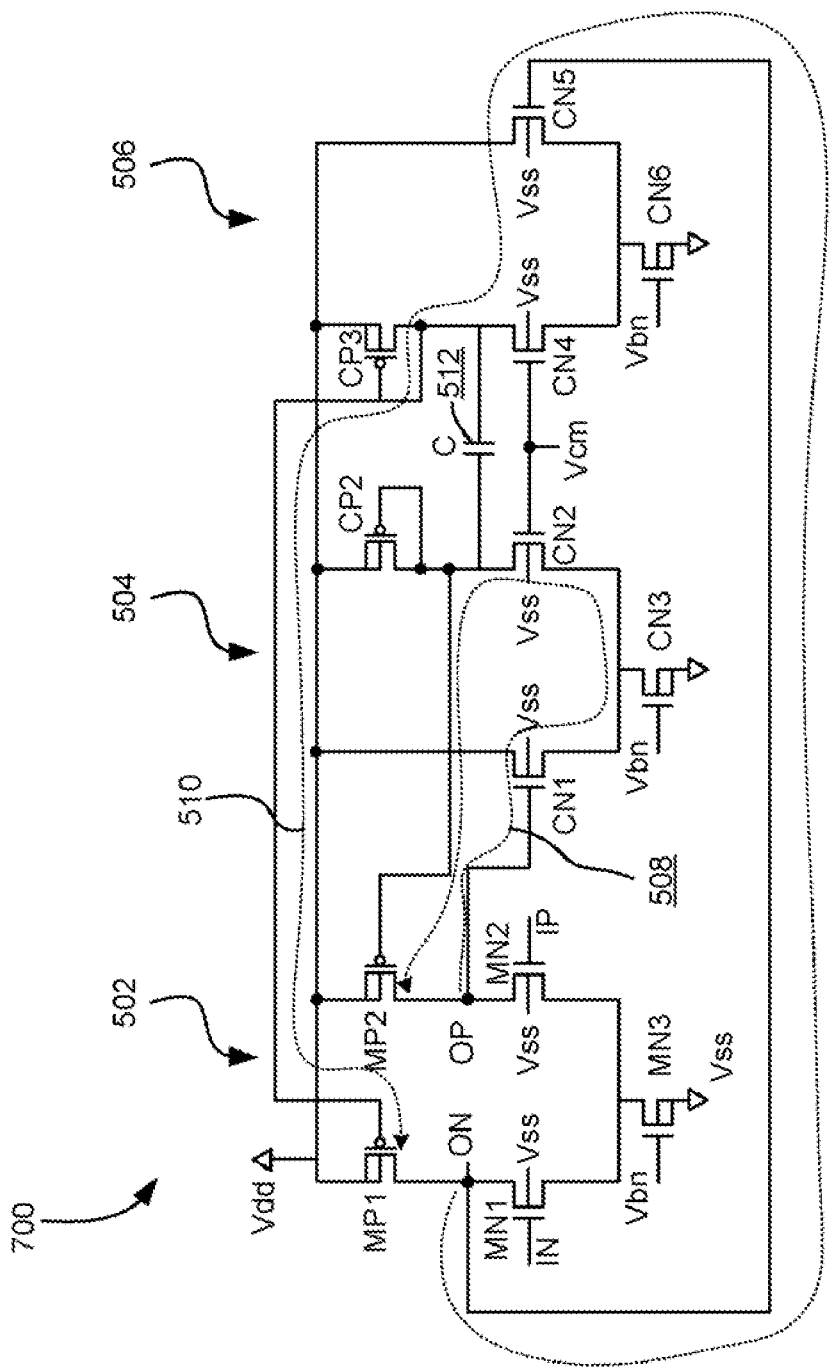
FIG. 9 is a circuit diagram of a fully differential amplifier circuit according to another embodiment of the present invention.

FIG. 9 illustrates another alternate embodiment 700, wherein the second and third sections 504. 506 have no CP1 and CP4.

Figure 10:
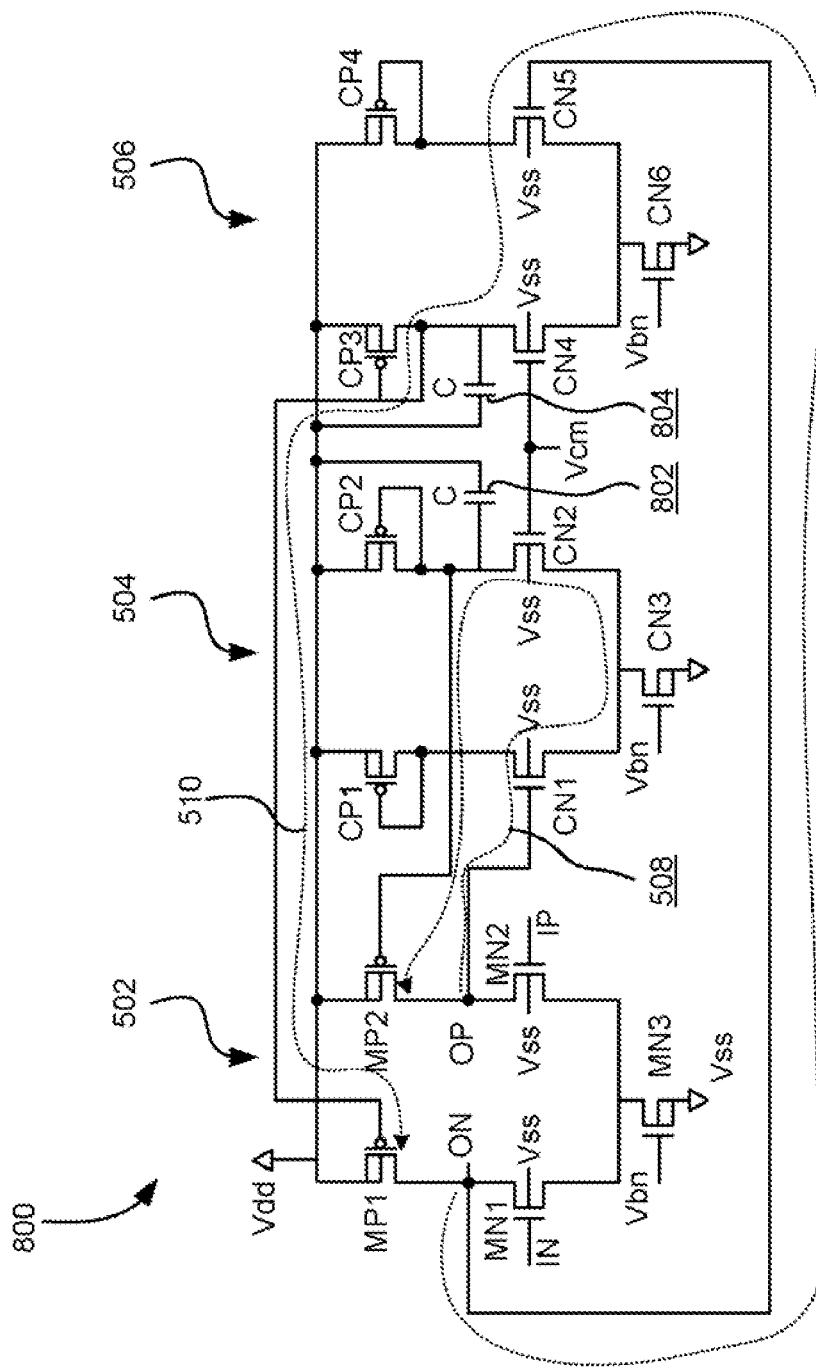
FIG. 10 is a circuit diagram of a fully differential amplifier circuit according to yet another embodiment of the present invention.

FIG. 10 illustrates an alternate embodiment 800, where the second and third sections 504, 506 each have an individual capacitor 802, 804 associated therewith. In this way, the first and second feedback loops 508, 510 are each coupled to an individual low-pass filter created by the respective section and capacitor combination.

While the embodiments shown in FIGS. 5 and 8-10, and variations thereof, are suitable for many applications, they may have certain limitations in other applications, making embodiments described subsequently preferred for some applications. For instance, to maintain low bandwidth filter characteristics, the current flowing through the second and third sections of the embodiments shown in FIGS. 5 and 8-10 needs to be very low. However, the first section might need a large amount of current to achieve large bandwidth for quick settling, pattern jitter reduction, and amplification purposes. In such a case, the current flowing through first section load should be much larger than the currents in the second and third section loads. This large ratio of the current in the first section to current in the second and third sections could create a large mismatched mirroring current. This mismatched current may create a new- offset voltage factor.

To maintain the effectiveness of offset voltage reduction, the first section needs to operate with limited current, so the ratio of first section current to second and third section currents, respectively, can be kept small. However a small current for the first, section implies that the first section will have a narrow bandwidth. The small bandwidth might not be enough for the intended application.

Loop stability is also improved in the following embodiments. In at least some of the prior embodiments, for a negative feedback loop, the returning signal should be attenuated enough without phase shift as to be additive to the loop input, so oscillation won't occur. To create a low pass filter function, the second and third sections each have a low frequency pole at their output nodes. However, the first section output ON or OP could have another low frequency pole. Also feed-through right-hand-side zeros from the second and third section output to the first section output raise the stability issue. These closer poles and zeros are not as stable as the following embodiments.

Therefore, one practicing the teachings herein may want to use the following embodiments having improved effectiveness of offset reduction, higher signal bandwidth capability, and higher loop stability.

The following embodiments improve on the embodiments described above by providing one or more of the following improvements. First, the current mismatch between loading device of the first section and second and third sections, respectively should be reduced as much as possible. Second, the first section bandwidth should not be limited by the effectiveness of offset cancellation. Third, the poles and zeros should either be positioned far away from one another or eliminated, so the negative feedback loop exhibits improved stability.

Figure 11:
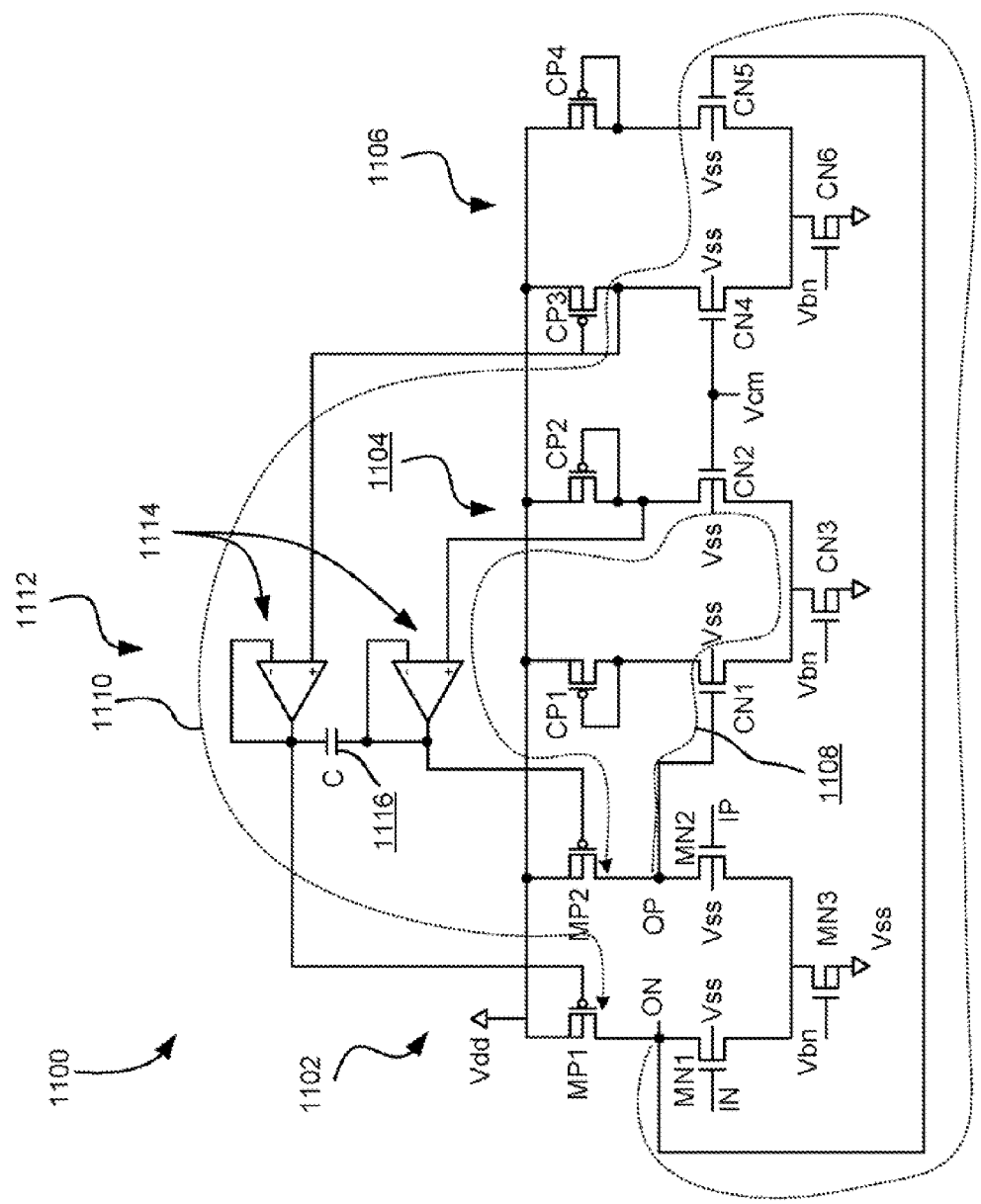
FIG. 11 is a circuit diagram of a fully differential amplifier circuit according to a further embodiment of the present invention.

FIG. 11 depicts a circuit 1100 that combines the ability to set a DC common mode output voltage with DC output offset cancellation. This circuit 1100 can function as a fully differential amplifier. As shown, the circuit 1100 includes first, second and third sections 1102, 1104, 1106. Each of these sections is preferably a differential cell, similar to that described above with respect to FIGS. 5, 8, 9 or 10. An amplifier implementing the fully differential amplifier circuit 1100 may include multiple stages, each stage being substantially like the circuit 1100 shown.

The first section 1102 is the main amplification section, which amplifies input signals IN, IP. In an RFID application, input signals IN, IP originating from an AM detector are passed to the first section 1102. In other applications, input signals IN, IP can be from another signal source. Differential output signals ON, OP are generated from the input signals IN, IP, The first section 1102 shown includes a pair of transistors MN1, MN2 which are controlled by the input signals IN, IP. The first section 1102 also includes a pair of transistors MP1, MP2 which are controlled by negative feedback loops 1108, 1110, respectively, the general paths of which are shown in dashed lines. How the negative feedback loops 1108, 1110 function in conjunction with the various sections of the circuit 1100 is presented in more detail below. Each differential output ON, OP is monitored separately.

The second section 1104 in this exemplary embodiment includes transistors CP1, CP2, CN1, CN2, and CN3. The third section 1106 in this exemplary embodiment includes transistors CP3, CP4, CN4, CN5, and CN6. The second and third sections 1104, 1106 compensate for the offset voltage and also set the common mode output via the negative feedback loops 1108, 1110.

Each feedback loop can individually adjust output DC voltages OP and ON, toward a common mode reference voltage Vcm. By sensing the DC output voltage of the output signals OP and ON and by comparing the output signals OP and ON with the desired output DC voltage level Vcm, the output signals OP and ON are adjusted to be at about the same level as Vcm via the respective feedback loop, In operation, for example, to set output signal OP to about the common mode voltage level, the output OP is compared with Vcm in the second section 1104 of the circuit 1100 via transistors CN1 and CN2. If the output OP is higher than Vcm, the first feedback loop 1108 weakens transistor MP2 and draws down the output signal OP. The third section 1106 functions similarly with the second feedback loop 1110 to set output signal ON to about the common mode voltage level.

The negative feedback scheme not only sets a DC common mode voltage but also adjusts any DC difference between OP and ON toward Vcm. This DC difference between OP and ON is the output offset voltage, when IN and IP have the same DC voltage. The offset voltage is caused by MN1 and MN2 or MP1 and MP2 devices in the circuit 1102 not being perfectly matched due to manufacturing variations, etc.

A filter section 1112 is located between the first section, e.g., gate of the load pmos, and the outputs of the second and third sections 1104, 1106. The filter section acts as a low pass filter to filter out high frequency signals from the high feedback loops. Accordingly, MP1 and MP2 will not respond to the now-removed high frequency portion of the feedback signals.

Because offset voltage and common mode voltage are DC values, the filter section 1112 preferably includes a capacitor (C) 1116. Combining the capacitor 1116 and one or more amplifiers, e.g., one or more unity gain buffers 1114, a Sow pass filter is created by taking advantage of the amplifier's gain rolling-off frequency response. The low pass filter limits both the common mode and differential mode feedback loop bandwidth by its unit, gain bandwidth—fu; meanwhile, it maintains feedback loop gain at a lower frequency for correction. The resultant differential mode feedback loop bandwidth is smaller than the frequencies of input signals IN, IP, but the common mode loop bandwidth can be larger than the frequencies of input signals IN, IP. In this way, the offset and DC output information can pass through each loop; common mode voltage is set and offset voltage correction are achieved by the two individual negative feedback loops 1108, 1110.

Again, the purpose of the circuit is to amplify the incoming signals IN, IP, so the filtering is preferably selected to cancel only the DC signal offset while allowing high frequency signals to be amplified and output, while low frequencies are fed back to provide the offset cancellation. High frequencies can broadly be defined as frequencies in about the vicinity of the data portion frequency of the Incoming signals IN, IP while low frequencies are somewhere below the data frequency range. Illustratively, high frequencies are greater than about 2 kHz, e.g., 2 kHz and 8 kHz, while low frequencies are smaller than about 2 kHz, e.g., below 1 kHz. In other words, because it is undesirable to cancel the desired part of the signal (high frequency), the low pass filter is implemented to only allow the low frequency part of the differential feedback signal to pass. Thus the feedback has no cancelling effect on the high frequency (desired) signal. The common mode feedback loop has a wider bandwidth and responds faster.

Accordingly, the same two negative feedback loops 1108, 1110 provide both an offset cancellation signal for cancelling the offset voltage, as well as a common mode adjustment signal.

While any type of low pass filtering scheme can potentially be used in the filter section 1112, a preferred embodiment implements two low bandwidth unity gain buffers 1114 connected as shown in FIG. 11. A loading capacitor 1116 is coupled to the outputs of the unity gain buffers 1114.

Figure 12:
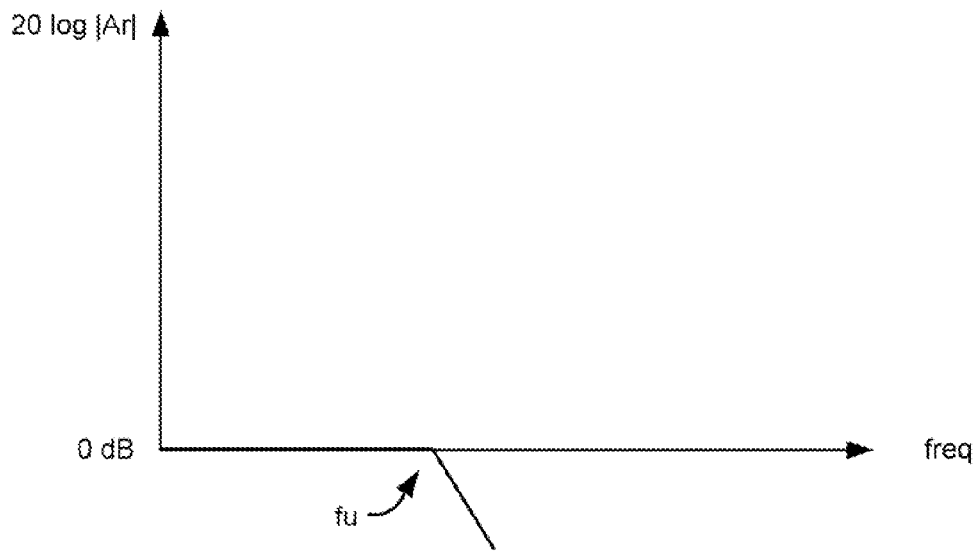
FIG. 12 is graph depicting a unit gain buffer frequency response.

By decoupling the filtering from the second and third sections 1104, 1106, the second and third sections 1104, 1106 are not limited by low current and low bandwidth. With a small current, the unity gain buffers 1114 operate in the subthreshold region, so it has high output impendence. The high output impendence with loading capacitor C 1116 creates a dominant pole for each feedback loop 1108, 1110. The filter section 1112, thus acts as a low pass filter. As shown in FIG. 12, the low pass filter section 1112 may provide a specified amount of gain until about fu. After fu, the gain rolls off. In an illustrative embodiment for RFID applications, the gain may be about −1 db to 1 db, preferably about 0 db, but could be higher or lower than said range.

With continued reference to FIG. 11, the second and third sections 1104, 1106 may operate without current amount restriction, so the ratio of the current applied to the first section 1102 to the current applied to each of the second and third sections 1104, 1106 respectively can be maintained at less than about 10:1, preferably less than about 5:1, more preferably less than about 2:1, and ideally about 1:1. A current ratio close to 1:1 minimizes any mismatch current due to current, mirroring. Also, the output of the second and third sections 1104, 1106 may have signals at a higher frequency because of the position of the capacitor 1116 and lower output impedance from a larger bias current.

With a low current mirroring ratio, there is little if any bandwidth restriction for the first section 1102 for offset cancellation purposes. Further, because a high current and low impendence may be implemented in the second and third sections 1104, 1106, the outputs of the second and third sections 1104, 1106 may have a higher frequency. The outputs of the second and third sections 1104, 1106 may be located relatively far away from the dominant pole created by the unity gain buffer 1114 and capacitor 1116. The feedback loops become unconditionally stable because the dominant pole is far away from other poles and zeros.

Accordingly, the embodiment shown in FIG. 11 provides improved performance over the previous embodiments in several respects. It keeps two independent loops with stable condition by implementation of the amplifiers (preferably unity gain buffers). In addition, the bandwidth limitation for the first section is solved by using a small current ratio of the current loading of the first section to that of the second and third sections. Also, the offset voltage between OP and ON is reduced without sacrificing signal amplification performance of the first section.

To conserve power, as well as operate with very low input signal strength, the transistors in any of the sections 1102, 1104, 1106 can operate in the subthreshold range. The transistors in the circuit can also run at strong inversion. Transistors operated in high impedance regions are preferred to keep power consumption low. For instance, the low pass filter frequency is preferably lower than 1 kHz, so it may not be practically applicable to use a purely RC circuit for monolithic application. Because the resistance value is more than several Mega ohms, such a large value resistor would need a huge area on the wafer and would create huge and unpredictable parasitic capacitance. In contrast, in preferred embodiments of the present invention, each low pass feedback loop may take advantage of MOS transistor sub-threshold characteristics: low current and high impedance to achieve low pass filtering, low power consumption, and save silicon die area.

Figure 13:
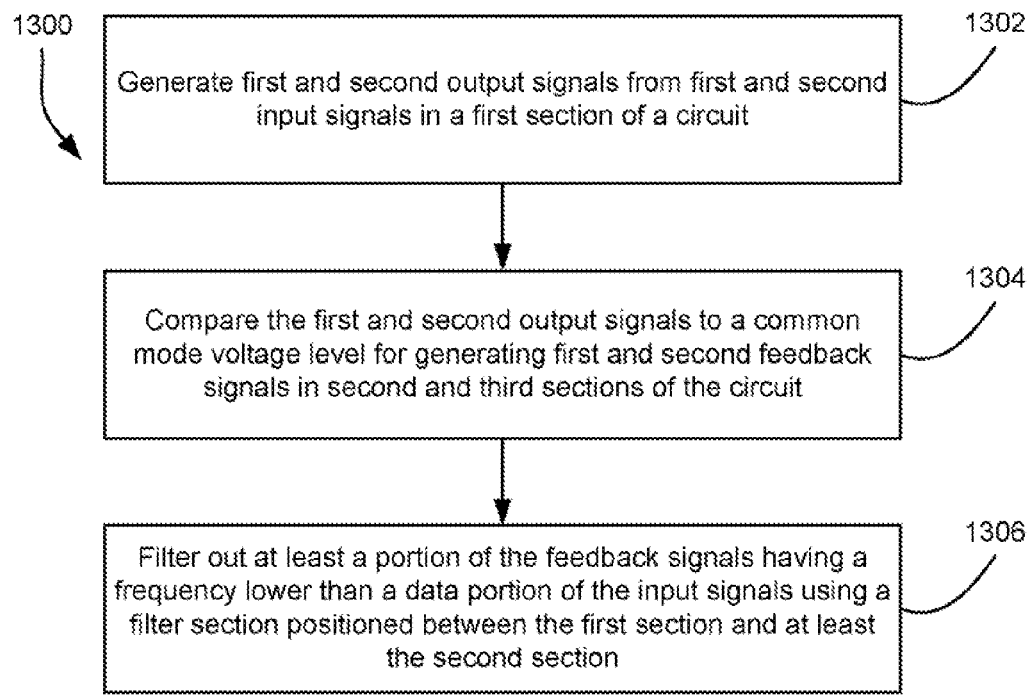
FIG. 13 illustrates a general method for setting a voltage level and cancelling an offset voltage of an amplified signal, according to one embodiment.

FIG. 13 illustrates a general method 1300 for setting a voltage level and cancelling an offset voltage of an amplified signal, according to one embodiment. In operation 1302, first and second output signals are generated from first and second input signals in a first section of a circuit. In operation 1304, the first and second output signals are compared to a common mode voltage level for generating first and second feedback signals in second and third sections of the circuit. In operation 1306, at least a portion of the feedback signals having a frequency lower than a data portion of the input signals is filtered out using a filter section positioned between the first section and at least the second section. The feedback signals simultaneously adjust the first and second output signals towards the common mode voltage level and reducing an offset voltage of the first and second output signals.

It should be kept in mind that the various components of the embodiments described herein can be mixed and matched to create other embodiments and permutations of the present invention.

Also, in any of the embodiments herein, the first, second, and third secession implementing transistors could be their complimentary counterparts.

Again it is emphasized that the embodiments described herein have broad application to fields outside of RF and RFID technologies.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A fully differential amplifier circuit, comprising:
a first section for generating first and second output signals on first and second outputs from first and second input signals;
a first feedback loop coupled to the first section, the first feedback loop including a second section for adjusting the first output signal towards a common mode voltage level, and for reducing an offset voltage of the first output signal;

a second feedback loop coupled to the first section, the second feedback loop including a third section for adjusting the second output signal towards the common mode voltage level, and for reducing an offset voltage of the second output signal; and a filter section positioned on the first and second feedback loops between outputs of the second and third sections and the first section.

2. A circuit as recited in claim 1, wherein the first, second and third sections are differential cells.

3. A circuit as recited in claim 1, wherein the first section includes a first transistor being controlled by the first input signal and a second transistor being controlled by the third section; wherein the first section further includes a third transistor being controlled by the second input signal and a fourth transistor being controlled by the second section.

4. A circuit as recited in claim 3, wherein the transistors operate in a subthreshold region thereof.

5. A circuit as recited in claim 1, wherein the filter section acts as a low pass filter.

6. A circuit as recited in claim 1, wherein signals from the filter section reduce the offset voltages of the first and second output signals and set a common mode voltage of the first and second output signals.

7. A circuit as recited in claim 1, wherein the filter section includes a first unity gain buffer coupled to the first feedback loop and a second unity gain buffer coupled to the second feedback loop, wherein outputs from the first and second unity gain buffers are coupled together via a capacitor.

8. A circuit as recited in claim 1, wherein the filter section filters out substantially all signals from the feedback loops having about the same frequency as data portions of the input signals.

9. A circuit as recited in claim 1, wherein the filter section includes a unity gain buffer.

10. A circuit as recited in claim 1, wherein the first feedback loop couples the first output to the second section, wherein the second feedback loop couples the second output to the third section.

11. A circuit as recited in claim 1, wherein a ratio of a current applied to the first section to a current applied to the second section is less than about 5:1.

12. A circuit as recited in claim 1, wherein a ratio of a current applied to the first section to a current applied to the second section is less than about 2:1.

13. A Radio Frequency Identification (RFID) system, comprising:
a plurality of RFID tags each having a circuit as recited in claim 1; and
an RFID interrogator in communication with the RFID tags.

14. A fully differential amplifier circuit, comprising:
a first section for generating first and second output signals on first and second outputs from first and second input signals;
a first negative feedback loop coupling the first output to a filter section, the first negative feedback loop adjusting the first output signal towards a common mode voltage level, and reducing an offset voltage of the first output signal;
a second negative feedback loop coupling the second output to the filter section, the second negative feedback loop controlling the second negative feedback loop for adjusting the second output signal towards the common mode voltage level, and reducing an offset voltage of the second output signal,
wherein the filter section acts as a low pass filter.

15. A circuit as recited in claim 14, wherein the filter section includes a first unity gain buffer coupled to the first feedback loop and a second unity gain buffer coupled to the second feedback loop, wherein outputs from the first and second unity gain buffers are coupled together via a capacitor.

16. A circuit as recited in claim 14, wherein the first negative feedback loop further comprises a second section, wherein the second negative feedback loop further comprises a third section, wherein the first section includes a first transistor being controlled by the first input signal and a second transistor being controlled by the third section via the second negative feedback loop; wherein the first section further includes a third transistor being controlled by the second input signal and a fourth transistor being controlled by the second section via the first negative feedback loop.

17. A circuit as recited in claim 16, wherein the transistors operate in a subthreshold region thereof.

18. A circuit as recited in claim 14, wherein the filter section includes a unity gain buffer.

19. circuit as recited in claim 14, wherein a ratio of a current applied to the first section to a current applied to the second section is less than about 5:1.

20. A circuit as recited in claim 14, wherein a ratio of a current applied to the first section to a current applied to the second section is less than about 2:1.

21. A Radio Frequency Identification (RF1D) system, comprising:
a plurality of RFID tags each having a circuit as recited in claim 14; and
an RFID interrogator in communication with the RFID tags.

22. A fully differential amplifier circuit, comprising:
a first differential cell for generating first and second output signals on first and second outputs from first and second input signals;
a first negative feedback loop coupled to the first output of the first differential cell, the first negative feedback loop including a second differential cell for generating a first feedback signal, the feedback signal being for adjusting the first output signal towards a common mode voltage level, and for reducing an offset voltage of the first output signal;
a second negative feedback loop coupled to the second output of the first differential cell, the second negative feedback loop including a third differential cell controlling the second negative feedback loop for generating a first feedback signal, the feedback signal being for adjusting the second output signal towards the common mode voltage level, and for reducing an offset voltage of the second output signal; and
a low pass filter section positioned between the first differential cell and the second and third differential cells, the low pass filter section being for filtering the first and second feedback signals.

23. A circuit as recited in claim 22, wherein the first differential cell includes a first transistor being controlled by the first input signal and a second transistor being controlled by the third differential cell via the second negative feedback loop; wherein the first section further includes a third transistor being controlled by the second input signal and a fourth transistor being controlled by the second differential cell via the first negative feedback loop.

24. A circuit as recited in claim 23, wherein the transistors operate in a subthreshold region thereof.

25. A circuit as recited in claim 22, wherein the low pass filter section filters out substantially all differential signals from the negative feedback loops having about the same frequency as data portions of the input signals.

26. A circuit as recited in claim 22, wherein the low pass filter section includes a first unity gain buffer coupled to the first feedback loop and a second unity gain buffer coupled to the second feedback loop, wherein outputs from the first and second buffers are coupled together via a capacitor.

27. A circuit as recited in claim 22, wherein the low pass filter section includes a unity gain buffer.

28. A circuit as recited in claim 22, wherein a ratio of a current applied to the first differential cell to a current applied to the second differential cell is less than about 5:1.

29. A circuit as recited in claim 22, wherein a ratio of a current applied to the first differential cell to a current applied to the second differential cell is less than about 2:1.

30. A Radio Frequency Identification (RFID) system, comprising:
    a plurality of RFID tags each having a circuit as recited in claim 22; and
    an RFID interrogator in communication with the RFID tags.

31. A method for setting a voltage level and cancelling an offset voltage of an amplified signal, comprising:
    generating first and second output signals from first and second input signals in a first section of a circuit;
    comparing the first and second output signals to a common mode voltage level for generating first and second feedback signals in second and third sections of the circuit; and
    filtering out from the feedback signals at least at least a portion thereof having a frequency lower than a data portion of the input signals using a filter section positioned between the first section and at least the second section, the feedback signals simultaneously adjusting the first and second output signals towards the common mode voltage level and reducing an offset voltage of the first and second output signals.

* * * * *

UNITED STATES PATENT AND TRADEMARK OFFICE
CERTIFICATE OF CORRECTION

PATENT NO. : 8,076,973 B2  
APPLICATION NO. : 11/677909  
DATED : December 13, 2011  
INVENTOR(S) : Yang et al.

Page 1 of 1

It is certified that error appears in the above-identified patent and that said Letters Patent is hereby corrected as shown below:

In the specification:
In column 1, line 55, "MH4" should be replaced with --MN4--.
In column 2, line 11, "non-identical, in" should be replaced with --non-identical. In--.
In column 2, line 11, "1. MN1" should be replaced with --1, MN1--.
In column 2, line 27, "Vera" should be replaced with --Vcm--.
In column 2, line 36, "Vent" should be replaced with --Vcm--.
In column 2, line 39, "Vera" should be replaced with --Vcm--.
In column 4, line 5, "," should be replaced with --;--.
In column 4, line 67, "," should be replaced with --.--.
In column 5, line 16, a --,-- should be added between "product" and "such".
In column 6, line 23, "Interface" should be replaced with --interface--.
In column 6, line 27, a --,-- should be added between "brief" and "the".
In column 6, line 30, "Include" should be replaced with --include--.
In column 7, lines 18-19, a --,-- should be added between "IN" and "IP".
In column 7, line 41, "Vent" should be replaced with --Vcm--.
In column 7, line 51, "OF" should be replaced with --OP--.
In column 7, line 52, "Vera" should be replaced with --Vcm--.
In column 9, line 8, "." should be replaced with --,--.
In column 10, line 36, "," should be replaced with --.--.
In column 10, line 62, "Sow" should be replaced with --low--.
In column 11, line 14, "Incoming" should be replaced with --incoming--.

In the claims:
In column 14, line 31, "(RF1D)" should be replaced with --(RFID)--.

Signed and Sealed this  
Tenth Day of April, 2012

David J. Kappos  
*Director of the United States Patent and Trademark Office*